(12) United States Patent
Hao et al.

(10) Patent No.: US 6,481,723 B1
(45) Date of Patent: Nov. 19, 2002

(54) LIFT PIN IMPACT MANAGEMENT (75) Inventors: Fangli J. Hao, Cupertino, CA (US); Dean Jay Larson, Mountain View, CA (US)

(73) Assignee: Lam Research Corporation, Fremont, CA (US)

( * ) Notice: Subject to any disclaimer, the term of this patent is extended or adjusted under 35 U.S.C. 154(b) by 32 days.

(21) Appl. No.: 09/823,469

(22) Filed: Mar. 30, 2001

(51) Int. Cl.[7] ................................................ B23B 31/28
(52) U.S. Cl. ......................... 279/128; 279/155; 269/71; 269/318; 269/903
(58) Field of Search ................................. 279/155, 128; 269/71, 907, 44, 54.3, 54.5, 54.4, 903, 249, 318, 315, 316, 319; 335/285; 414/936

(56) References Cited

U.S. PATENT DOCUMENTS 4,602,660 A * 7/1986 Alm
5,599,568 A * 2/1997 Donnell
5,607,362 A * 3/1997 Haber
5,655,413 A * 8/1997 Barton
5,815,366 A * 9/1998 Morita
6,305,677 B1 * 10/2001 Lenz
6,373,681 B2 * 4/2002 Kanno
6,403,322 B1 * 6/2002 Fischer

* cited by examiner

Primary Examiner—Stephen Blau
(74) Attorney, Agent, or Firm—Martine & Penilla, LLP (57) ABSTRACT

A pin stop and method of implementation suitable for use lift pin assemblies used in semiconductor process environments is provided. The pin stop includes a pin shaft and a circular pin head with soft stop and hard stop features defined thereon. The soft stop feature is defined in a grove in the pin head surface and is configured to impact a stopping surface slowing movement of a lift pin assembly. The hard stop then impacts the stopping surface providing a constant, reliable and repeatable position of a wafer positioned on the lift pin assembly.

21 Claims, 5 Drawing Sheets

LIFT PIN IMPACT MANAGEMENT

BACKGROUND OF THE INVENTION

1. Field of the Invention

The present invention relates generally to the preparation of substrates such as those used in semiconductor fabrication as well as in the manufacture of hard disk drives, and more particularly to a stop for pin lifter devices configured to raise and lower substrates.

2. Description of the Related Art

In the fabrication of semiconductor devices, there is a need to perform a variety of substrate preparation and fabrication operations in which substrates such as silicon wafers are manipulated within a process environment such as a process chamber. A common method of substrate manipulation is the use of lift pins that are configured to contact a wafer, typically on a back side or non-active surface of the substrate, and with a minimum of surface area contact. In the plurality of fabrication processes that may be performed in a process chamber, the substrate may be raised or lowered as required for both manipulation within the process chamber as well as in preparation for insertion into and removal from the process chamber.

Figure 1A:
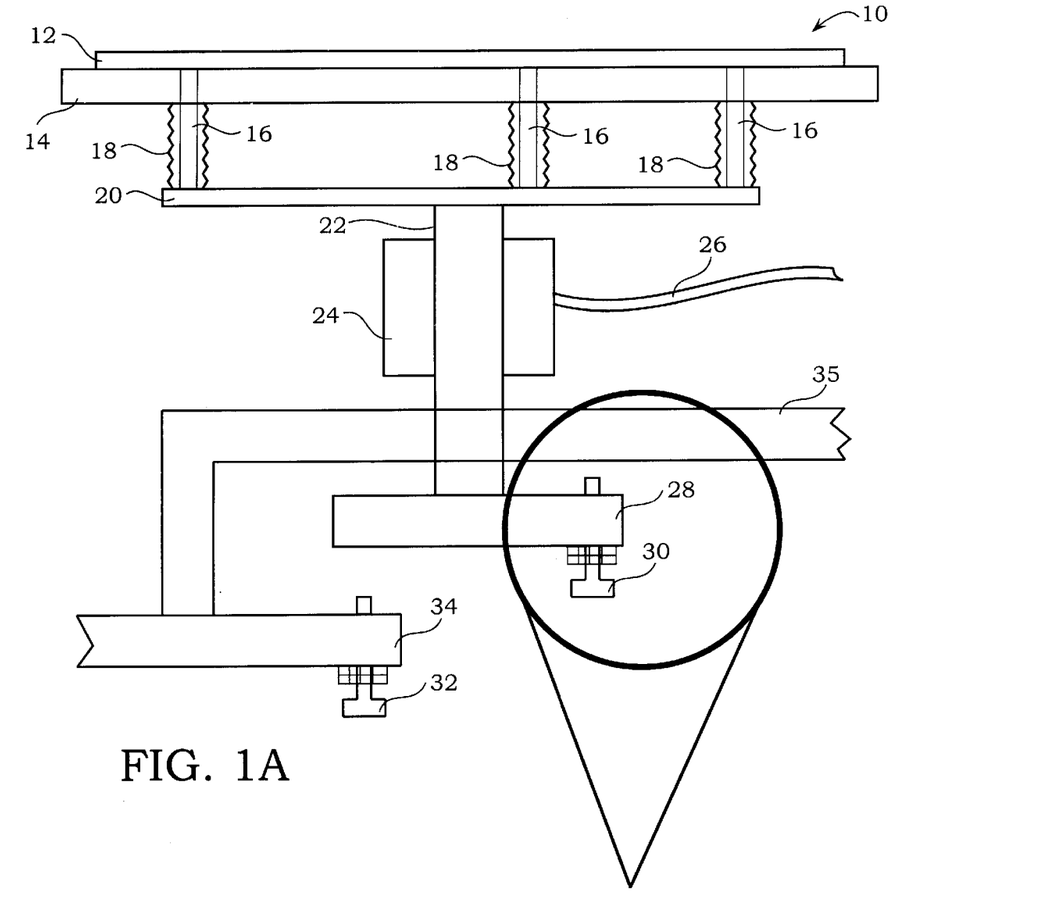
FIG. 1A shows a typical lift pin assembly within a process chamber.

In the prior art, lift pins are configured to raise and lower a substrate between constant, fixed positions in a processing environment such as a process chamber. FIG. 1A shows a typical lift pin assembly 10 within a process chamber. Lift pins 16 are attached to a yoke 20, and travel through a support chuck 14 to a back side of a wafer 12. When a wafer is to be lifted, the lift pins 16 are configured to contact the back side of the wafer 12 in at least three points to raise the wafer 12 off the support chuck 14. The lift pins 16 then withdraw through the support chuck 14 and lower the wafer 12 on to the support chuck 14. As is known, when a wafer 12 is disposed on the support chuck 14, there is no contact between the lift pins 16 and the wafer 12. Bellows 18 are configured around each of the lift pins 16 between the support chuck 14 and the yoke 20 enclosing the lift pins 16 and preventing any contamination of the portion of the lift pin that travels through the support chuck 14.

The yoke 20 is attached to a shaft 22 which is raised and lowered by an actuator 24. The actuator is typically pneumatic, and can also be electrical. The raising and lowering of shaft 22 raises and lowers the yoke 20 which raises and lowers the lift pins 16 in contact with the wafer 12. The actuator 24 receives pneumatic supply, or electrical power and control through cable 26.

The lower portion of the lift pin assembly 10 includes the lift pin stops 30, 32. An upper pin stop 30 is inserted through an upper pin stop housing plate 28. The upper pin stop housing plate is connected to shaft 22. Contact between the upper pin stop 30 and an upper pin stop plate 35 halts upward travel of the shaft 22 and raising of the lift pins 16.

A lower pin stop 32 is inserted through a lower pin stop housing plate 34. Contact between the upper pin stop housing plate 28 and the lower pin stop 32 halts downward travel of the shaft 22 and lowering of the lift pins 16.

Figure 1B:
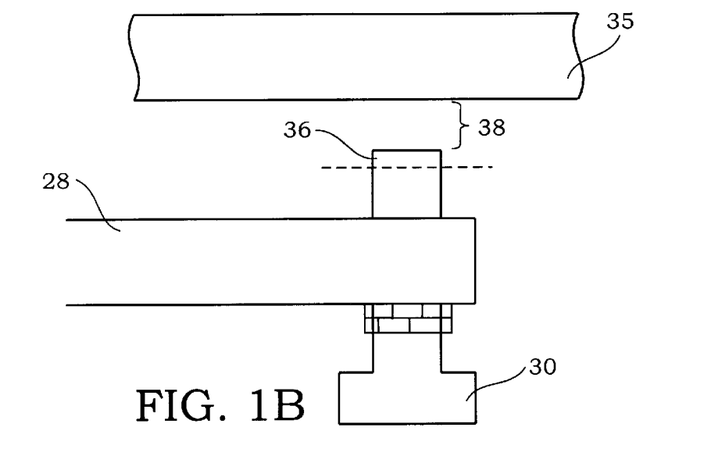
FIG. 1B shows a closer view of the lower pin stop shown in FIG. 1A.

FIG. 1B shows a closer view of upper pin stop 30 shown in FIG. 1A. As described in reference to FIG. 1A, the upper pin stop housing plate 28 is attached to shaft 22 (not shown in FIG. 1B). As the lift pin assembly 10 lifts the wafer 12, upper pin stop housing 28 travels upward closing a gap 38 between upper pin stop housing plate 28 and upper pin stop plate 35. Upward travel of upper pin stop housing plate 28 is halted by contact between a tip 36 of upper pin stop 30 and upper pin stop plate 35. Upper pin stop 30 thus stops the raising of lift pins 16 and the wafer 12.

FIG. 1B shows that upper pin stop 30 is configured through upper pin stop housing plate 28. Typically, pin stops 30 and 32 are threaded to provide for adjustment of the pin stop 30, 32 position in housing plates 28, 34. The position of the upper pin stop 30 is therefore adjustable by raising or lowering the upper pin stop 30 in upper pin stop housing plate 28. Adjustment of upper pin stop 30 sets the upper extent of the lift pin assembly 10 by establishing the point at which upper travel of upper pin stop housing plate 28 is halted. In a similar manner, the lower pin stop 32 (See FIG. 1A) sets the lower extent of the lift pin assembly 10.

As can be seen in FIG. 1B, the contact between the tip 36 of upper pin stop 30 and the upper pin stop plate 35 that halts upward travel is a direct, surface to surface contact. In some prior art applications, the material from which the upper pin stop plate 35 is constructed is metal, and the material from which the upper pin stop 30 is constructed is metal, and so the resulting contact is metal to metal contact. In some prior art applications, the upper pin stop 30 has been constructed of a hard plastic, and so the resulting contact is hard plastic to metal. Additionally, some prior art applications incorporate hard plastic layers over the contact areas, also known as stopping surfaces, of upper pin stop housing plate 28 (See FIG. 1A) and upper pin stop plate 35.

Each of the above described types of contact used in a pin stop assembly 10 result in problems with prior art pin stops. In the configuration where a metal pin stop 30, contacts a metal upper pin stop plate 35, the result is an abrupt, hard stop. An abrupt, hard stop is a rapid deceleration caused by hard surface to surface contact typically causing lift pin 16 vibration, bounce, or noise. The metal to metal hard stop can be so abrupt and hard that wafer 12 shifting on the lift pins 16 can result, and in some cases, wafer 12 fracture. Wafer 12 shifting, however slight, can be detrimental to process operations. By way of example, in plasma etching operations, wafer shifting introduces intolerable variance into the process.

The use of hard plastic pin stops or the use of hard plastic layers over the stopping surfaces and resulting hard plastic to metal contact can dampen an abrupt hard stop, but introduces inaccuracies in wafer 12 positioning. Over time, hard plastic exhibits deformation. The deformation results in a change in wafer 12 positioning, and a known requirement in wafer processing is constant, predictable wafer 12 positioning. Hard plastic deformation can result from repeated impact and contact in accordance with pin stop function and design, and can be exacerbated by heat. The deformation of hard plastic used in a hard plastic to metal contact configuration introduces an unacceptable variance.

One approach, as described above, to mitigating the problems associated with hard stops is to re-configure the metal to metal contact by, for example, introducing a hard plastic alternative. It has been found that hard plastic is generally unacceptable, as already described. Another approach to the hard stop problems is to mechanically dampen the movement of the shaft 22 (See FIG. 1A) at the actuator 24 (See FIG. 1A). Unfortunately, known mechanical dampening techniques require more space than is available within a process chamber, and tend to contribute unacceptable cost to design and manufacture.

In view of the foregoing, there is a need to develop and implement a pin stop that can be easily and inexpensively utilized in all manner of substrate lift pin assemblies. The pin stop design should be able to be implemented in existing lift pin assemblies such as those within semiconductor wafer process chambers with a minimum of available space. The pin stop should reduce or eliminate the prior art problems caused by hard stops resulting in wafer shifting or breakage.

SUMMARY OF THE INVENTION

Broadly speaking, the present invention fills these needs by providing a simple pin stop that is easily integrated into existing systems and assemblies, and produces a consistent, repeatable, and reliable pin stop while minimizing and eliminating unacceptable wafer shifting or breakage. The present invention can be implemented in numerous ways, including as a process, an apparatus, a system, a device, or a method. Several embodiments of the present invention are described below.

In one embodiment, a yoke having a plurality of lift pins for the lifting and lowering of a substrate and connected to a pin stop housing plate is provided. The pin stop housing plate includes a pin stop having a head. In the head of the pin stop is a face in which is configured a contact surface that is designed to halt movement of the yoke when the contact surface abuts a stop surface. The contact surface includes a hard stop and a soft stop. The soft stop is configured to compress against the stop surface until the stop surface meets the hard stop.

In another embodiment, an apparatus for stopping movement of a yoke used in a wafer processing system is provided. The apparatus includes a pin shaft and a head connected to the pin shaft. The head has a contact surface that is defined by a hard stop and a soft stop. The hard stop and the soft stop are configured to impact a stopping surface to halt movement of the yoke. The head also has a recess for receiving the soft stop. The soft stop is configured to compress against the stopping surface until the hard stop meets the stopping surface.

In still a further embodiment, a pin stop for stopping movement of a lift pin assembly is provided. The lift pin assembly has a yoke with a set of lift pins and a shaft that moves the yoke into a down position and an up position. The shaft has a yoke connection end connecting the shaft to the yoke, and a stop connection end connecting the shaft to a pin shaft. The pin shaft has a head which has a hard stop and a soft stop. The hard stop and the soft stop are configured to impact a stopping surface and halt the movement of the shaft. The soft stop is configured to compress against the stopping surface until the hard stop contacts the stopping surface.

In yet another embodiment, a method for controlling an abrupt stopping motion of a shaft is provided. The method includes moving a contact surface toward a stopping surface and then absorbing an initial impact between the contact surface and the stopping surface. The absorbing is designed to compress a soft stop component of the contact surface. The method then provides for halting the movement of the contact surface when a hard stop component of the contact surface meets the stopping surface.

The advantages of the present invention are numerous. One notable benefit and advantage of the invention is the elimination of unacceptable wafer shifting or breakage resulting from current hard stop apparatus. By combining the dampening effects of a soft stop with the constant, repeatable and reliable wafer positioning of a hard stop, a lift pin stop is provided that is simple in design and easily implemented to increase reliability of substrate processing and handling.

Another significant advantage is the simplicity of design of the present invention. Although mechanical dampening of the pin stop might produce desirable results, such dampening implementations require space and complexity for various apparatus that are not feasible for process chamber applications. The present invention provides a simple design that is easily implemented in existing and future applications without requiring additional space or complexity. Space considerations are particularly stringent requirements in process chamber applications, and the present invention provides the notable advantage of being easily implemented in process chambers. Additionally, the present invention provides a notable cost savings by being economical to manufacture and install, and by reducing cost of manufacture by reducing or eliminating wafer shifting or breakage and resulting scrap losses.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for a pin stop for use in lift pin assemblies is disclosed. In preferred embodiments, the pin stop includes a flat head and a combination of a soft stop for dampened deceleration and a hard stop for constant, repeatable, and reliable stop positioning. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2:
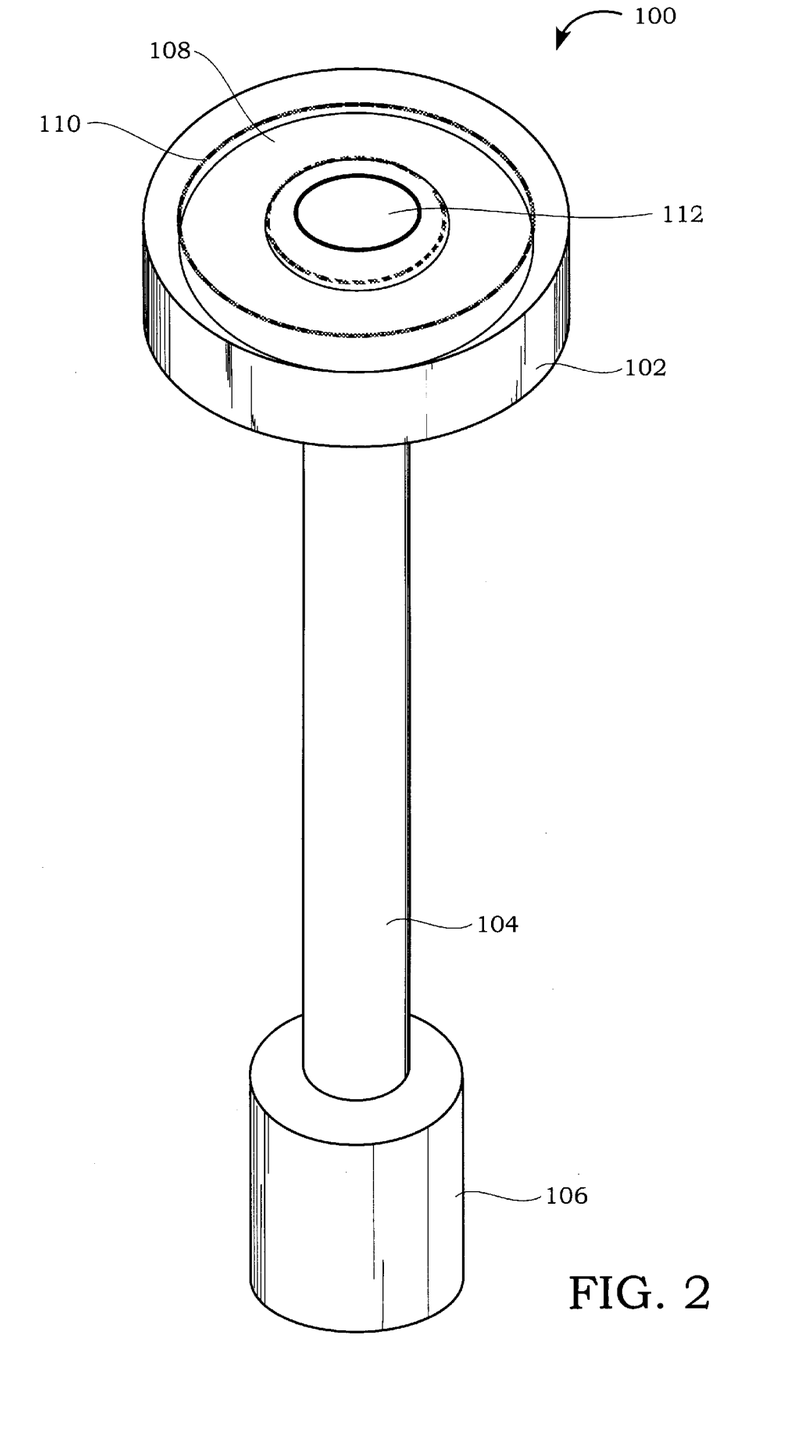
FIG. 2 illustrates a combination pin stop in accordance with one embodiment of the present invention.

FIG. 2 illustrates a combination pin stop 100 in accordance with one embodiment of the present invention. The combination pin stop 100 includes a head 102, center shaft 104, and base 106. The center shaft 104 is also known as a pin shaft and pin post. In one embodiment, the center shaft 104 is threaded (not shown) to provide combination pin stop 100 positional adjustment within a mounting.

The head 102 of combination pin stop 100 includes a flat face 108 having a soft stop component 110 and a hard stop component 112 configured therein. The soft stop component 110 includes such structures as a washer, bushing, o-ring, or other similar structures to provide an initial soft stop dampened deceleration feature to the combination pin stop 100. The washer, bushing, o-ring or other similar structure that is the soft stop component 110 can be constructed of any generally flexible and elastic material such as rubber, fiber, polystyrene, and the like. Additional desired properties include strength, resilience, and resistance to heat. In a preferred embodiment of the present invention, the soft stop component is constructed of viton or fluorosilicon.

The hard stop component 112 configured on the flat face 108 of the combination pin stop 100 is constructed of generally hard, unforgiving material such a metal. The hard stop component 112 is configured to provide the combination pin stop 100 with the repeatable, reliable stop position characteristic, and therefore is designed to provide a hard and constant surface. Any material suitable for process chamber operation that provides strength, light weight, hardness, and low particulate generation such as stainless steel can be used for the hard stop component.

The base 106 is generally configured to provide a feature with which to adjust the position of the combination pin stop 100 within a pin stop housing. As described above, center shaft 104 includes threads in one embodiment for position adjustment within a pin stop housing. Base 106 provides a surface upon which to act with necessary force, such as torsion, to adjust the position of the combination pin stop 100.

Figure 3A:
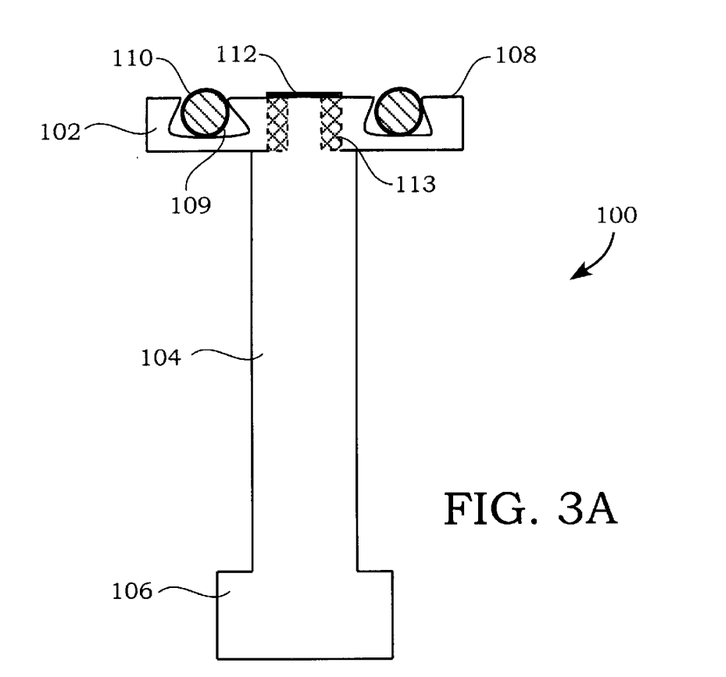
FIG. 3A illustrates a cross-section of combination pin stop in accordance with one embodiment of the present invention.

FIG. 3A illustrates a cross-section of combination pin stop 100 in accordance with one embodiment of the present invention. As can be seen in FIG. 3A, head 102 of combination pin stop 100 incorporates features providing both soft stop 110 and hard stop 112 components. In one embodiment, groove 109 is configured in head 102 which is open in face 108. Soft stop 110 is configured to be inserted in groove 109 such that a portion of soft stop 110 is below the plane of face 108 in groove 109 in head 102, and a portion of soft stop 110 is above the surface of the plane of face 108, and above the plane of the hard stop 112. Groove 109 is configured to provide a region into which soft stop 110 can be forced as pressure is applied to a surface of soft stop 110. In one embodiment of the present invention, the surface to surface contact corresponding to that contact described in reference to FIGS. 1A and 1B correlates to soft stop 110 and hard stop 112 contacting a stopping surface (not shown in FIG. 3A). Face 108 is configured to contain soft stop 110 and hard stop 112 features, but does not contact the stopping surface. Soft stop 110 absorbs first contact and begins deceleration of the pin stop 100. As pressure between surfaces of soft stop 110 and the stopping surface increases, soft stop 110 is compressed and forced further into groove 109. As described above, soft stop 110 is constructed of flexible and elastic materials to allow for absorbing and compressing, as well as return to original shape and volume when pressure is removed.

Attachment 113 is provided to attach head 102 to center shaft 104. Combination pin stop 100 is configured to be compatible with existing pin stop structures. In order to insert a combination pin stop 100 in a housing plate (not shown in FIG. 3A), it is necessary to remove head 102. In prior art pin stop structures, the head feature is substantially the same size as the shaft. In one embodiment of the present invention, head 106 is large enough to accommodate a face 108 in which is configured a groove 109 for holding a soft stop 110. A hard stop 112 is configured substantially over the shaft 104 on face 108. Because head 102 is generally larger than shaft 104, attachment 113 is provided to allow shaft 104 to be inserted into a housing plate (not shown in FIG. 3A), and then head 102 to be attached to center shaft 104 after center shaft 104 is positioned in a housing plate.

Figure 3B:
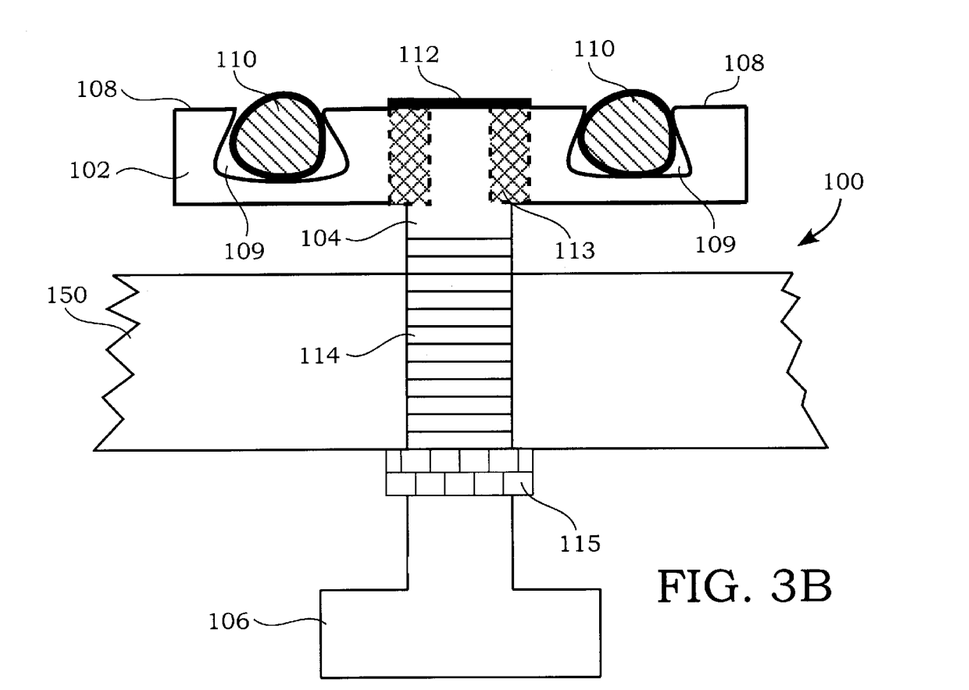
FIG. 3B shows a combination pin stop configured in a housing plate in accordance with an embodiment of the invention.

FIG. 3B shows a combination pin stop 100 configured in a housing plate 150 in accordance with an embodiment of the invention. Threads 114 are provided on shaft 104 in order to fix and adjust the position of the combination pin stop 100 in housing plate 150. Corresponding threads (not shown) are provided in housing plate 150. Base 106 can be used to raise and lower the combination pin stop 100 with applied torsion to advance or retract the threaded shaft 114 along the threaded housing plate 150. Knurled nuts 115 secure the combination pin stop at a desired position within the housing plate 150.

FIG. 3B further illustrates a soft stop 110 configured in groove 109 in face 108 of head 102. Hard stop 112 is configured in the center of face 108 substantially over shaft 104. Attachment 113 is shown providing attachment for head 102 to shaft 104. Attachment 113 is of known mechanical configuration including threaded attachment, slotted attachment, pinned attachment, and the like.

Figure 4:
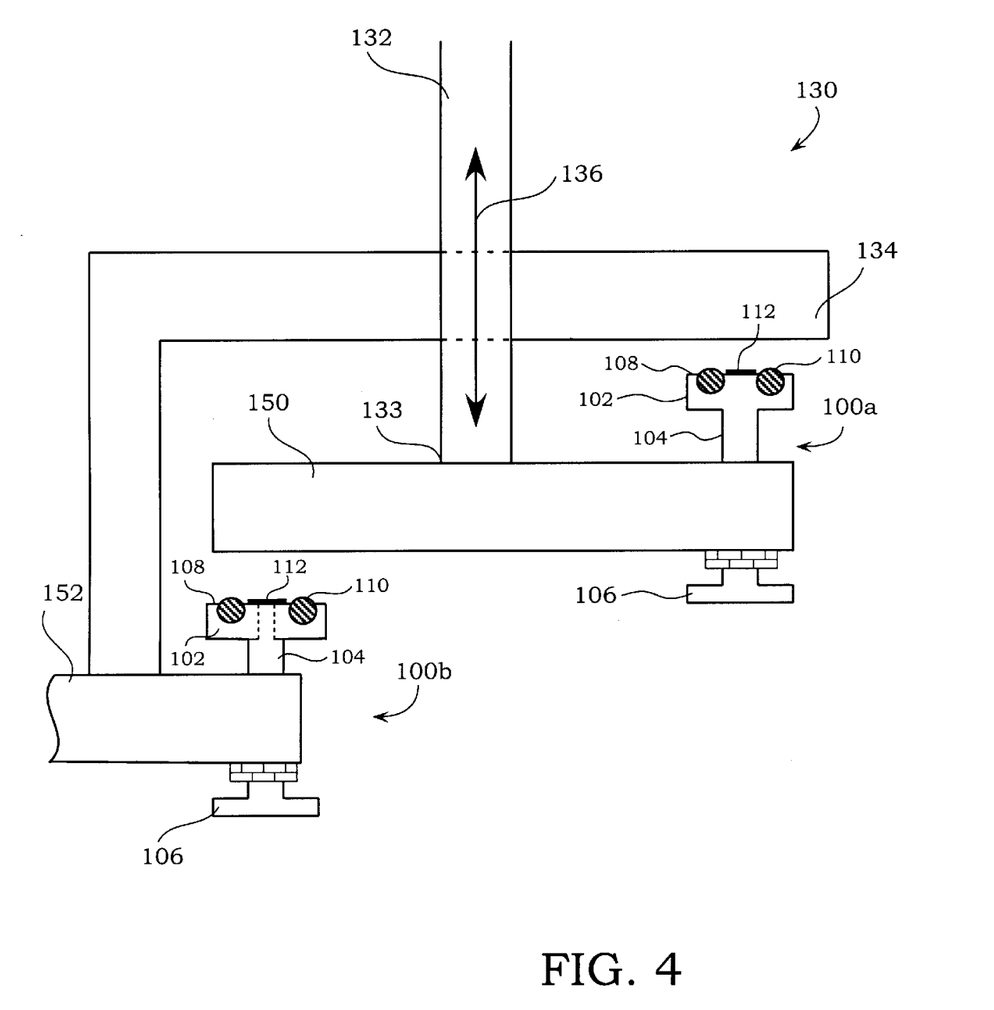
FIG. 4 shows a pin stop assembly implementing a combination pin stop in accordance with one embodiment of the present invention.

FIG. 4 shows a pin stop assembly 130 implementing a combination pin stop 100 in accordance with one embodiment of the present invention. The illustrated pin stop assembly 130 includes an upper pin stop plate 134, an upper pin stop housing plate 150, an upper combination pin stop 100a, a lower pin stop housing plate 152, and a lower combination pin stop 100b. Shaft 132 is connected to upper pin stop housing plate 150 at a stop connection end 133. Shaft 132 is ultimately connected to a yoke at a yoke connection end, and the yoke is configured to hold lift pins (not shown in FIG. 4).

Movement of shaft 132 in directions shown by directional arrow 136 corresponds to the raising and lowering of lift pins (not shown in FIG. 4). The raising of the lift pins includes a movement in an upward direction of shaft 132. As can be seen in FIG. 4, as shaft 132 moves in an upward direction, upper pin stop housing plate 150 moves upward with shaft 132, the upper pin stop housing plate 150 being connected to shaft 132 at stop connection end 133. As upper pin stop housing plate 150 travels upward, upper combination pin stop 100a travels upward approaching upper pin stop plate 134. Upward travel is first slowed when soft stop 110 abuts a stopping surface on an under surface of upper pin stop plate 134. Upward travel is then halted when the hard stop 112 of upper combination pin stop 100a contacts a stopping surface on an under surface of upper pin stop plate 134 as is described in greater detail below.

The lowering of the lift pins includes a movement in a downward direction of shaft 136. As shaft 136 moves in a downward direction, upper pin stop housing plate 150 moves downward with shaft 132. The upper pin stop housing plate 150 thus moves downward toward lower combination pin stop 100b. Downward travel is halted when the hard stop 112 of lower combination pin stop 100b contacts a stopping surface on an under surface of upper pin stop housing plate 150.

As can be appreciated, when shaft 132 travels downward and therefore lowers the lift pins (not shown in FIG. 4), contact between the hard stop 112 of lower combination pin stop 100b and a stopping surface on an under surface of upper pin stop housing plate 150 halts downward travel. As described in reference to FIG. 1A, the lowering of the lift pins withdraws the lift pins into a support chuck and positions a wafer on the support chuck. With the wafer positioned on the support chuck, there is no contact between the wafer and the lift pins and it is therefore of little consequence how hard or soft the stop is when the lift pins are lowered. When raising the lift pins, however, a wafer is positioned on at least three lift pins, and the halting of the upward travel of the lift pins by upper pin stop 100a contributes to the occurrence or non-occurrence of the undesirable wafer shifting, jumping, or breakage. The embodiments of the present invention are configured to reduce and eliminate such undesirable consequences. In a preferred embodiment, the combination pin stop 100a need only be configured to the upper pin stop position, and FIG. 4 is shown with combination pin stops 100a, 100b in both the upper and lower pin stop positions in accordance with an alternative embodiment.

Referring once again to the detail of FIG. 3B, it should be appreciated that as upper combination pin stop 100a approaches the under surface of upper pin stop plate 134, contact first occurs when soft stop 110 abuts the stopping surface. As upward travel continues, soft stop 110 is compressed and slows upward travel until hard stop 112 contacts the under surface of the upper pin stop plate 134. Hard stop 112 provides a constant, repeatable, and reliable stop point for the lift pins (not shown). Upward travel is halted, and the lift pins are positioned in the same position each and every time.

As described above in reference to FIG. 2, one embodiment of the present invention uses viton as a soft stop 110. As is known, viton is available in different rated degrees of hardness called durameters. The lower the durameter number, the higher the degree of softness or sponginess. In one embodiment of the present invention, the viton rating can range between about 40 durameters and about 90 durameters, with an optimal rating at about 60 to 70 durameters. The durameter of the selected material for soft stop 110 can be varied according to the specific process and environment. By way of example, a large or heavy substrate may support a higher durameter rating than a smaller or lighter substrate. Additional factors such as temperature or pressure in the processing environment, and in the vicinity of the pin stops, may indicate variation in the durameter of the selected material for a soft stop. In one embodiment, the soft stop 110 functions to dampen the deceleration of the pin stop 100 without insulating or preventing the hard stop 112 from producing a constant, reliable, and repeatable stop.

Figure 5A:
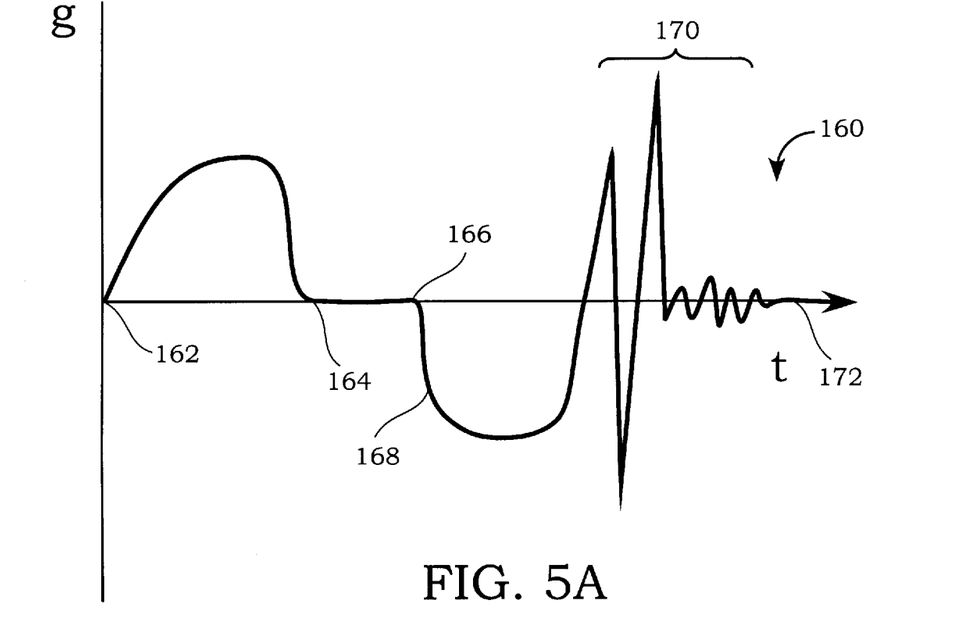
FIG. 5A is a graph of acceleration over time of a pin stop using a typical hard stop.
Figure 5B:
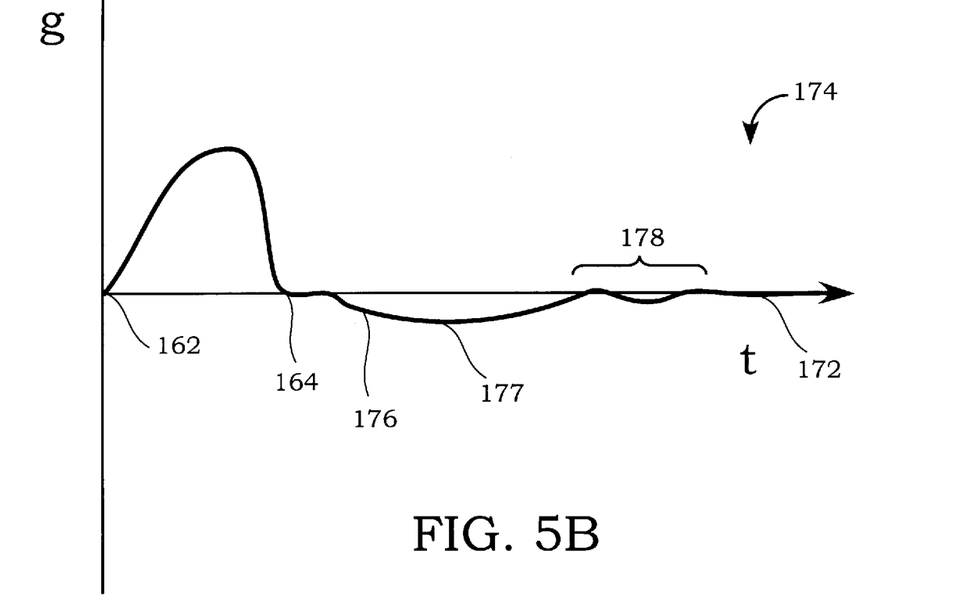
FIG. 5B shows a graph of acceleration over time of a pin stop using a combination pin stop in accordance with an embodiment of the present invention.

FIGS. 5A and 5B present a graphical representation of the effect of the combination of soft and hard stops in one combination pin stop. FIG. 5A is a graph 160 of acceleration over time of a pin stop using a typical hard stop. Acceleration "g" is denoted on the vertical axis, and time "t" is denoted on the horizontal axis so that the graph 160 shows the variance of acceleration over time. Point 162 represents time 0 when the action of the lift pin is initiated. The pin stop accelerates to a point 164 at which time it achieves constant velocity. At point 166, the hard stop contacts the pin stop surface resulting in immediate and abrupt deceleration (negative acceleration) 168. The abrupt, hard stop results in vibration or noise shown in region 170 before returning to steady state at 172. It is during the region shown as 170 that undesirable wafer shifting or breakage occurs.

FIG. 5B shows a graph 174 of acceleration over time of a pin stop using a combination pin stop in accordance with an embodiment of the present invention. As in FIG. 5A, acceleration "g" is denoted on the vertical axis, and time "t" is denoted on the horizontal axis so that the graph 174 shows the variance of acceleration over time. Point 162 represents time 0 when the action of the lift pin is initiated. The pin stop accelerates to a point 164 at which time it achieves constant velocity. At point 176, the soft stop contacts the pin stopping surface resulting in a gradual deceleration until the hard stop contacts the pin stop surface at point 177. After the hard stop halts travel at the constant, repeatable and reliable position, there is some resulting noise 178 prior to steady state 172, but it is much less pronounced than with a typical hard stop, and much less likely to produce wafer shifting or breakage.

Thus configured, the combination pin stop dampens the deceleration of the pin stop while maintaining a constant, reliable, and repeatable pin stop and wafer positioning. The present invention provides an effective pin stop without increasing the complexity of the design and adjustment of lift pin assemblies, and is configurable to existing lift pin assembly applications. The present invention provides for reducing or eliminating wafer shifting and wafer breakage.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A yoke having a plurality of lift pins for lifting and lowering a substrate from and onto an electrostatic chuck, the yoke being connected to a shaft that is driven by an actuator so as to move the yoke, the shaft being coupled to a pin stop housing plate, the pin stop housing plate including,
   a pin stop, the pin stop having a head configured with a face that includes a contact surface, the contact surface being configured to abut a stop surface so as to halt movement of the shaft, the contact surface including a hard stop and a soft stop, the soft stop being configured to compress against the stop surface until the stop surface meets the hard stop.

2. The pin stop housing plate as recited in claim 1, wherein the head has a circular structure.

3. The pin stop housing plate as recited in claim 2, wherein the face has a groove, the groove being defined in the circular structure of the head and being configured to define a position on the face for the soft stop, and to provide a region into which the soft stop is compressed.

4. The pin stop housing plate as recited in claim 3, wherein the soft stop is one of an o-ring, a washer and a bushing.

5. The pin stop housing plate as recited in claim 3, wherein the soft stop is defined from a compressible material.

6. The pin stop housing plate as recited in claim 1, wherein the head of the pin stop attaches to a pin shaft.

7. The pin stop housing plate as recited in claim 6, wherein the pin shaft is threaded along an outer surface of the pin shaft.

8. The pin stop housing plate as recited in claim 7, wherein the pin shaft is attached to the pin stop housing plate.

9. The pin stop housing plate as recited in claim 1, wherein the hard stop is defined from metal, the hard stop being less compressible than the soft stop.

10. An apparatus for stopping movement of a yoke used in a wafer processing system, comprising:
- a pin shaft;
- a head connected to the pin shaft, the head having a contact surface defined by a hard stop and a soft stop, soft stop and the hard stop of the contact surface configured to impact a stopping surface so as to halt the movement of the yoke, the head having a recess for receiving the soft stop, the soft stop being configured to compress against the stopping surface up until the hard stop meets the stopping surface.

11. An apparatus for stopping movement of a yoke used in a wafer processing system as recited in claim 10, wherein the compressing of the soft stop reduces an acceleration of the yoke from a first position to a second position.

12. An apparatus for stopping movement of a yoke used in a wafer processing system as recited in claim 11, wherein the compressing of the soft stop absorbs an abrupt impact with the stopping surface.

13. An apparatus for stopping movement of a yoke used in a wafer processing system as recited in claim 12, wherein the soft stop is defined of viton.

14. An apparatus for stopping movement of a yoke used in a wafer processing system as recited in claim 12, wherein the hard stop halts the movement of the yoke after the soft stop reduces the acceleration.

15. An apparatus for stopping movement of a yoke used in a wafer processing system as recited in claim 14, wherein the hard stop is defined of metal.

16. A pin stop for stopping movement of a lift pin assembly having a yoke with a set of lift pins and a shaft that moves the yoke into one of a down position and an up position, the shaft having a yoke connection end and a stop connection end, comprising:
- a pin shaft being coupled to the stop connection end;
- a head connected to the pin shaft, the head having a hard stop and a soft stop, soft stop and the hard stop configured to impact a stopping surface so as to halt the movement of the shaft, the soft stop being configured to compress against the stopping surface up until the hard stop contacts the stopping surface.

17. A pin stop as recited in claim 16, wherein the pin shaft is coupled to the stop connection end with a pin shaft housing plate, the pin shaft housing plate being configured to provide a housing of the pin stop and positioning of the pin stop in opposition to the stopping surface.

18. A pin stop as recited in claim 17, wherein the pin shaft is configured with threads to provide positional adjustment of the pin shaft.

19. A pin stop as recited in claim 16, wherein the soft stop is one of an o-ring, a bushing, and a washer.

20. A pin stop as recited in claim 16, wherein the soft stop is defined of one of viton and fluorosilicon.

21. A pin stop as recited in claim 16, wherein the hard stop is defined of metal and is configured to provide a constant stopping position of the yoke.

* * * * *